United States Patent
Warren et al.

(10) Patent No.: US 11,645,894 B2
(45) Date of Patent: May 9, 2023

(54) DOORBELL CHIME BYPASS CIRCUIT

(71) Applicant: GOOGLE LLC, Mountain View, CA (US)

(72) Inventors: Daniel Adam Warren, San Francisco, CA (US); Eric Marschalkowski, Inning (DE); Brian Conner, San Jose, CA (US)

(73) Assignee: Google LLC, Mountain View, CA (US)

( * ) Notice: Subject to any disclaimer, the term of this patent is extended or adjusted under 35 U.S.C. 154(b) by 223 days.

(21) Appl. No.: 17/156,438

(22) Filed: Jan. 22, 2021

(65) Prior Publication Data

US 2022/0237993 A1    Jul. 28, 2022

(51) Int. Cl.
| | |
|---|---|
| *G08B 3/10* | (2006.01) |
| *H03K 17/082* | (2006.01) |
| *H03K 17/10* | (2006.01) |
| *H03K 17/12* | (2006.01) |
| *H03K 17/08* | (2006.01) |

(52) U.S. Cl.
CPC ........... *G08B 3/10* (2013.01); *H03K 17/0822* (2013.01); *H03K 17/102* (2013.01); *H03K 17/122* (2013.01); *H03K 2017/0806* (2013.01)

(58) Field of Classification Search
CPC .... G08B 3/10; H03K 17/0822; H03K 17/102; H03K 17/122; H03K 2017/0806
USPC ................ 327/427, 434, 436, 581
See application file for complete search history.

(56) References Cited

U.S. PATENT DOCUMENTS

| | | | |
|---|---|---|---|
| 3,774,191 A | 11/1973 | Enemark | |
| 7,429,924 B2 | 9/2008 | Langer et al. | |
| 9,619,955 B2 | 4/2017 | Eichenblatt | |
| 10,607,458 B1 | 3/2020 | Sampson et al. | |
| 10,803,719 B1 * | 10/2020 | Skeoch | G08B 13/19636 |
| 2005/0161960 A1 | 7/2005 | Ward | |

(Continued)

FOREIGN PATENT DOCUMENTS

WO    2019133110    7/2019

OTHER PUBLICATIONS

"Skybell wi-fi video doorbell", Retrieved at: http://www.skybell.com/product/skybell-video-doorbell-hd/—on Feb. 2019, 44 pages.

(Continued)

*Primary Examiner* — William Hernandez
(74) *Attorney, Agent, or Firm* — Colby Nipper PLLC

(57) ABSTRACT

A doorbell chime bypass circuit includes a first node, a second node, and a bi-directional FET switch in series with the first node and the second current node. The bi-directional FET switch includes a first FET and a second FET in series, and is configured to cease conducting current between the first and second nodes when gate voltages of the first and second FETs are below a cut-off threshold. The bypass circuit further includes a sensing circuit configured to determine a level of current flowing through the bi-directional FET switch, and a switch controller configured to set the gate voltages of the first and second FETs to a level below the cut-off threshold when the sensing circuit senses that the level of current meets a doorbell press current threshold, causing the bi-directional FET switch to cease conducting current between the first and second nodes.

20 Claims, 8 Drawing Sheets

(56) References Cited

U.S. PATENT DOCUMENTS

2018/0190083 A1 7/2018 Wu
2019/0056131 A1* 2/2019 Warren ................ H02J 50/001

OTHER PUBLICATIONS

"International Search Report and Written Opinion", Application No. PCT/US2022/011664, dated Jun. 2, 2022, 20 pages.
"Invitation to Pay Additional Fees and Partial Search Report", Application No. PCT/US2022/011664, dated Apr. 12, 2022, 8 pages.

* cited by examiner

DOORBELL CHIME BYPASS CIRCUIT

TECHNICAL FIELD

This relates generally to electronic doorbell chime bypass circuits, and specifically to solid state relay switches configured for use in such circuits.

BACKGROUND

Network-connected doorbell systems can implement features such as motion detection and audio/video interactions with on-board hardware. For example, a motion sensor, a speaker, and/or a camera may be integrated within the doorbell itself, with a wired power supply or a battery providing power. Since these components are integrated into the doorbell, the associated power circuitry within the doorbell can be designed for the exact specifications of each component. A doorbell chime, however, is usually external to the doorbell, and the power requirements of such a chime may be unknown to the manufacturer of a network-connected doorbell system.

Doorbell chimes may be powered by alternating current signals (e.g., 24 VAC). Network-connected doorbell systems that are designed to interface with such chimes typically use triodes for alternating current (TRIACs) to switch the chime power on and off. However, TRIACs are limited in the types of power signals that they can switch. For example, TRIACs cannot switch DC signals. As a result, doorbell systems using TRIAC-based switching circuits may not be compatible with DC-powered chimes. Further, TRIACs cause a voltage drop when conducting current, which limits the power available to the chime and adds heat to the system. As a result, doorbell systems using TRIAC-based switching circuits may not be compatible with low-power chimes due to the voltage drop or high-power chimes due to thermal issues caused by the added heat.

Network-connected doorbell systems may alternatively use a mechanical relay to switch the chime power on and off. However, mechanical relays tend to be large, expensive, and loud. In addition, mechanical relays may have a relatively limited lifetime, especially when operated in extreme environments (e.g., in hot weather or in direct sunlight), which may exacerbate thermal issues caused by internally generated heat.

SUMMARY

This disclosure describes a field effect transistor (FET) based solid state relay (SSR) that implements a one-size-fits-all approach to compatibility with doorbell chimes. The FET-based approaches described herein may switch both DC- and AC-powered doorbell chimes without the power, thermal, size, cost, noise, or durability constraints associated with a TRIAC-based or mechanical relay-based switching circuits. Since the use of FETs in power switching circuits may potentially cause operational complications (e.g., power overloads), the FET-based approaches described herein include protective features to address such complications. Such features include FET sequencing, switch timing, over-current protection, over-voltage protection, and/or over-temperature protection.

In one aspect, a doorbell chime bypass circuit includes a first current input/output node, a second current input/output node, and an SSR integrated circuit. The SSR integrated circuit includes a first bi-directional FET switch in series with the first current input/output node and the second current input/output node. The first bi-directional FET switch includes a first FET and a second FET in series, and is configured to cease conducting current between the first current input/output node and the second current input/output node when a gate voltage of the first FET and a gate voltage of the second FET are below a cut-off threshold. The SSR integrated circuit further includes a first sensing circuit configured to determine a level of current flowing through the first bi-directional FET switch, and a first switch controller configured to set the gate voltage of the first FET and the gate voltage of the second FET to a level below the cut-off threshold when the first sensing circuit senses that the level of current meets a doorbell press current threshold, causing the first bi-directional FET switch to cease conducting current between the first current input/output node and the second current input/output node.

In some implementations, the first switch controller is further configured to detect voltage zero-crossing events at the first bi-directional FET switch, and the SSR integrated circuit further includes a digital controller configured to cause the first FET and the second FET to turn off within a threshold of time of a detected zero-crossing event. In some implementations, the first switch controller is further configured to detect voltage peaks at the first bi-directional FET switch, and the SSR integrated circuit further includes a digital controller configured to cause the first FET and the second FET to turn on within a threshold of time of a detected voltage peak.

In some implementations, the first switch controller is further configured to determine a direction of current flowing through the first bi-directional FET switch, and the SSR integrated circuit further includes a digital controller configured to (i) cause the first FET to turn off before the second FET turns off in accordance with a determination that current is flowing from the first FET to the second FET, and (ii) cause the second FET to turn off before the first FET turns off in accordance with a determination that current is flowing from the second FET to the first FET. In some implementations, the first switch controller is further configured to determine relative voltage potentials at a drain of the first FET and a drain of the second FET, and the SSR integrated circuit further includes a digital controller configured to (i) cause the second FET to turn on before the first FET turns on in accordance with a determination that a voltage potential at the drain of the first FET is higher than a voltage potential at the drain of the second FET, and (ii) cause the first FET to turn on before the second FET turns on in accordance with a determination that a voltage potential at the drain of the second FET is higher than a voltage potential at the drain of the first FET.

In some implementations, the first sensing circuit is configured to detect a level of current flowing through the first bi-directional FET switch while the first FET and the second FET are on, and the SSR integrated circuit further includes a digital controller configured to cause circuitry powering the first bi-directional FET switch to power down in accordance with a detected level of current exceeding an over-current threshold. In some implementations, the first sensing circuit is configured to detect a voltage across the first bi-directional FET switch while the first FET and the second FET are off, and the SSR integrated circuit further includes a digital controller configured to cause circuitry powering the first bi-directional FET switch to power down in accordance with a detected voltage across the first bi-directional FET switch exceeding (i) a first over-voltage threshold within a first time period after the first FET and the second FET have been turned off, or (ii) a second over-voltage threshold lower than the first over-voltage threshold following the first time period. In some implementations, the SSR integrated circuit further includes a temperature sensor configured to detect a temperature proximate to the first bi-directional FET switch, and a digital controller configured to cause circuitry powering the first bi-directional FET switch to power down in accordance with a detected temperature proximate to the first bi-directional FET switch exceeding an over-temperature threshold.

BRIEF DESCRIPTION OF THE DRAWINGS

For a better understanding of the various described implementations, reference should be made to the Detailed Description below, in conjunction with the following drawings.

Like reference numerals refer to corresponding parts throughout the several views of the drawings.

DETAILED DESCRIPTION

Wired Doorbell

Figure 1A:
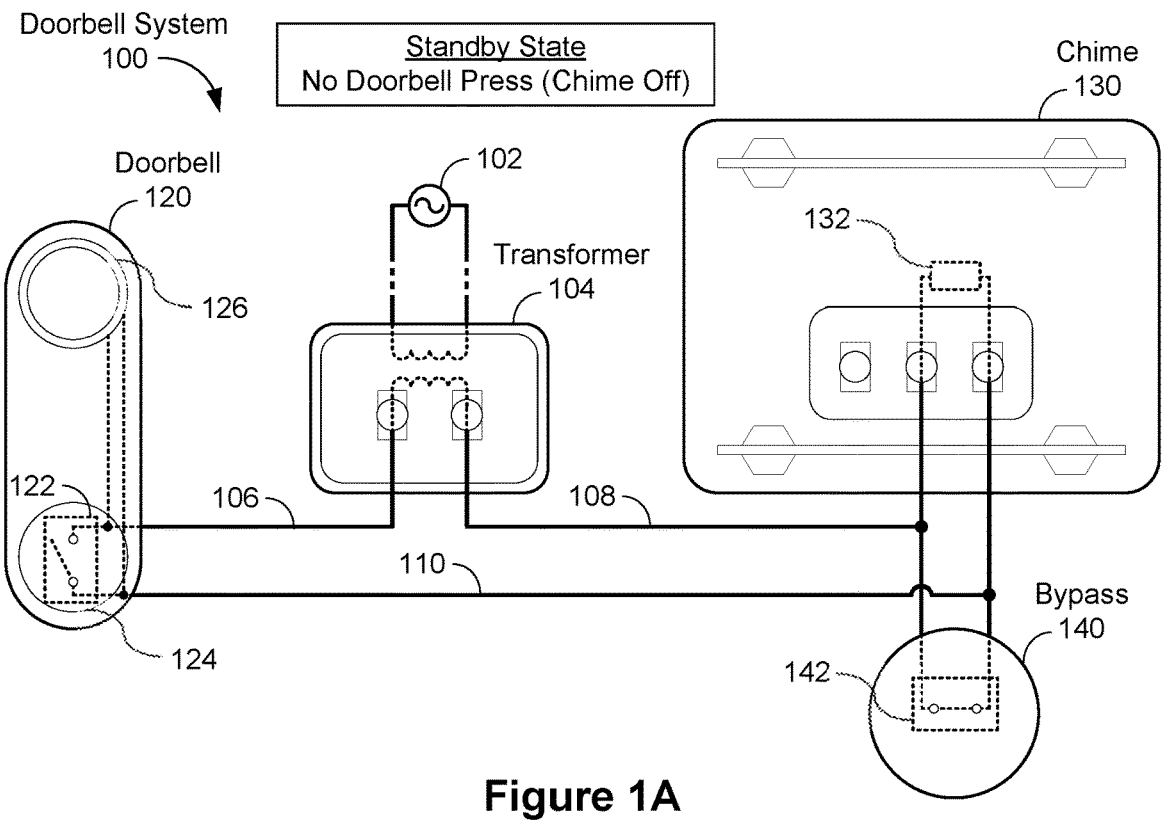
FIG. 1A is a diagram of a wired doorbell system in a standby state in accordance with some implementations.
Figure 1B:
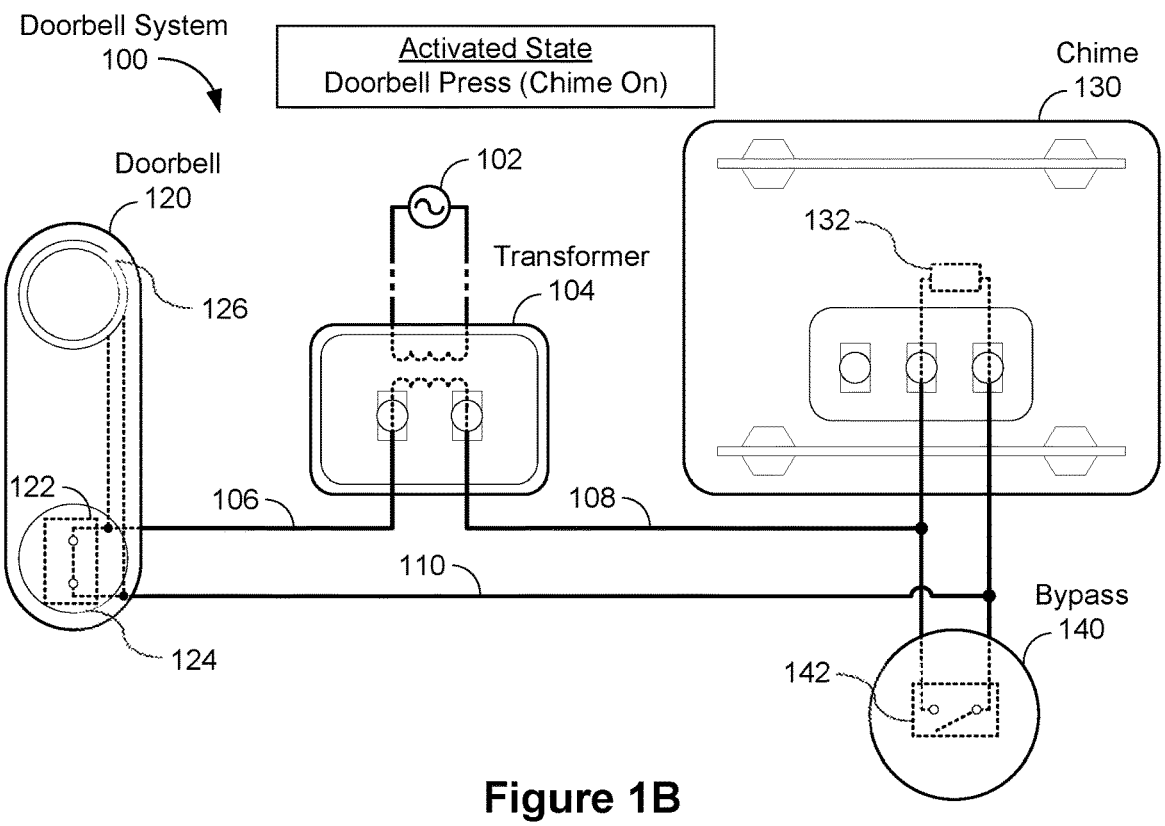
FIG. 1B is a diagram of a wired doorbell system in an activated state in accordance with some implementations.

FIGS. 1A and 1B are diagrams of a doorbell system 100 during various stages of a doorbell press event in accordance with some implementations. FIG. 1A depicts the doorbell system 100 in a standby state (a doorbell button 124 has not been pressed for at least a threshold of time, and the chime is off), and FIG. 1B depicts the doorbell system 100 in an activated state (the doorbell button 124 is being pressed or has been pressed within a threshold of time, and the chime is on). The doorbell system 100 includes a wired doorbell 120, a chime 130, and chime bypass circuitry 140 (also referred to as a bypass 140). The aforementioned components are electrically coupled via electrical lines (e.g., wires) 106, 108, and 110. Line 106 electrically couples the doorbell 120 to a transformer 104, line 108 electrically couples the transformer 104 to the chime 130 and the bypass 140, and line 110 electrically couples the doorbell 120 to the chime 130 and the bypass 140.

The chime 130 may be AC-powered or DC-powered. For AC-powered chimes (as depicted in FIGS. 1A and 1B), the doorbell system 100 includes an AC power source 102 and a transformer 104. The AC power source 102 may be mains power (e.g., a 120 VAC line signal entering a structure at a circuit breaker panel), and the transformer 104 may convert the mains power to a lower voltage (e.g., 24 VAC) to power the doorbell 120 and the chime 130. For DC-powered chimes (not depicted), the doorbell system would include a DC power source (not depicted) instead of or in addition to the AC power source 102 and, optionally, a power converter (e.g., a buck converter, not depicted) instead of or in addition to the transformer 104.

The doorbell 120 includes a button 124 and doorbell system circuitry 126. When pressed, the button 124 causes doorbell switch circuitry 122 to close a doorbell switch (described in more detail below with reference to switch 302 depicted in FIG. 3), thereby connecting (electrically coupling) lines 106 and 110. The doorbell switch circuitry 122 may keep the doorbell switch closed for as long as the button 124 is pressed, or for a threshold of time (e.g., a user-programmable threshold) after the button 124 has initially been pressed or has been released. The doorbell system circuitry 126 may include a camera (including an image sensor and image processing circuitry), a motion sensor, a microphone, a speaker, a transceiver, a processor, and/or any other electronic components configured to implement features of the doorbell system 120.

The chime 130 may be a mechanical chime (e.g., an electromagnetic chime including a solenoid 132 as depicted in FIGS. 1A and 1B) or an electronic chime (not depicted). The chime 130 may be powered by a voltage signal as low as 8V RMS (or lower), or as high as 28V RMS (or higher). Mechanical chimes may draw (i) a relatively low in-rush current (e.g., to charge an inductor) and (ii) a relatively high steady state current (e.g., to keep the solenoid 132 actuated or an armature moving). Electronic chimes, on the other hand, may draw (i) a relatively high in-rush current (e.g., to charge an input capacitor), and (ii) a relatively low steady state current (e.g., to power digital circuitry).

The bypass 140 includes switch circuitry 142 implementing a bypass switch (described in more detail below with reference to switch 402 depicted in FIG. 4). While the bypass switch in switch circuitry 142 is closed, lines 108 and 110 are connected (electrically coupled), thereby bypassing the chime 130. More specifically, while the bypass switch is closed, current flowing through lines 108 and 110 bypasses the chime, as the closed bypass switch provides the path of least resistance (e.g., compared to the path including the solenoid 132), thereby preventing the chime 130 from receiving enough current to operate. Conversely, when the bypass switch is open, current flowing through lines 108 and 110 must pass through the chime 130 (e.g., through the solenoid 132), thereby causing the chime 130 to be activated.

The configurations of the doorbell switch circuitry 122 and the bypass switch circuitry 142 determine whether the doorbell system 100 is in the standby state (no doorbell press, chime off) or the activated state (doorbell press, chime on).

Referring to FIG. 1A (standby state), while the doorbell button 124 is not pressed, the transformer 104 powers only the doorbell system circuitry 126 of the doorbell 120. This is because the bypass switch in the bypass switch circuitry 142 is closed, bypassing the chime 130 to direct all power to the doorbell 120. The doorbell switch in the doorbell switch circuitry 122 is connected across the doorbell AC power input (lines 106 and 110). As such, when the doorbell switch is open, AC current delivered via lines 106 and 110 is directed to the doorbell system circuitry 126. In sum, the current path in the standby state includes the transformer 104, line 108, bypass switch circuitry 142, line 110, doorbell system circuitry 126, and line 106.

Referring to FIG. 1B (activation state), when the doorbell button 124 is pressed, the doorbell switch in switch circuitry 122 closes, which causes the doorbell system circuitry 126 to be bypassed (during this state, a battery in the doorbell 120 may supply power to the doorbell system circuitry 126). As a result of the doorbell system circuitry 126 being bypassed, current at the input of the bypass switch circuitry 142 increases. The bypass switch circuitry 142 detects the increased current, which causes the bypass switch circuitry 142 to open the bypass switch. With the bypass switch open, all power (current flowing through lines 108 and 110) is directed to the chime 130, which causes the chime 130 to be activated. In sum, the current path in the activated state includes the transformer 104, line 108, chime 130, line 110, doorbell switch circuitry 122, and line 106.

The doorbell bypass switch may stay closed for a predetermined amount of time or a programmable amount of time (e.g., as selected in a doorbell application on a user device). The user may select an amount of time needed for the chime 130 to finish sounding (e.g., as short as 0.3 seconds (or shorter), or as long as 10 seconds (or longer)). After this time has passed, the doorbell switch in switch circuitry 122 opens, which causes voltage at the input of the bypass switch in switch circuitry 142 to drop (due to current being redirected to the doorbell system circuitry 126). The bypass switch circuitry 142 detects the decreased voltage across the bypass switch, which causes the bypass switch circuitry 142 to close the bypass switch, which cuts off power to the chime 130. At this point, the doorbell system 100 is back in the standby state with all power directed to the doorbell 120.

Wireless Doorbell

Figure 2A:
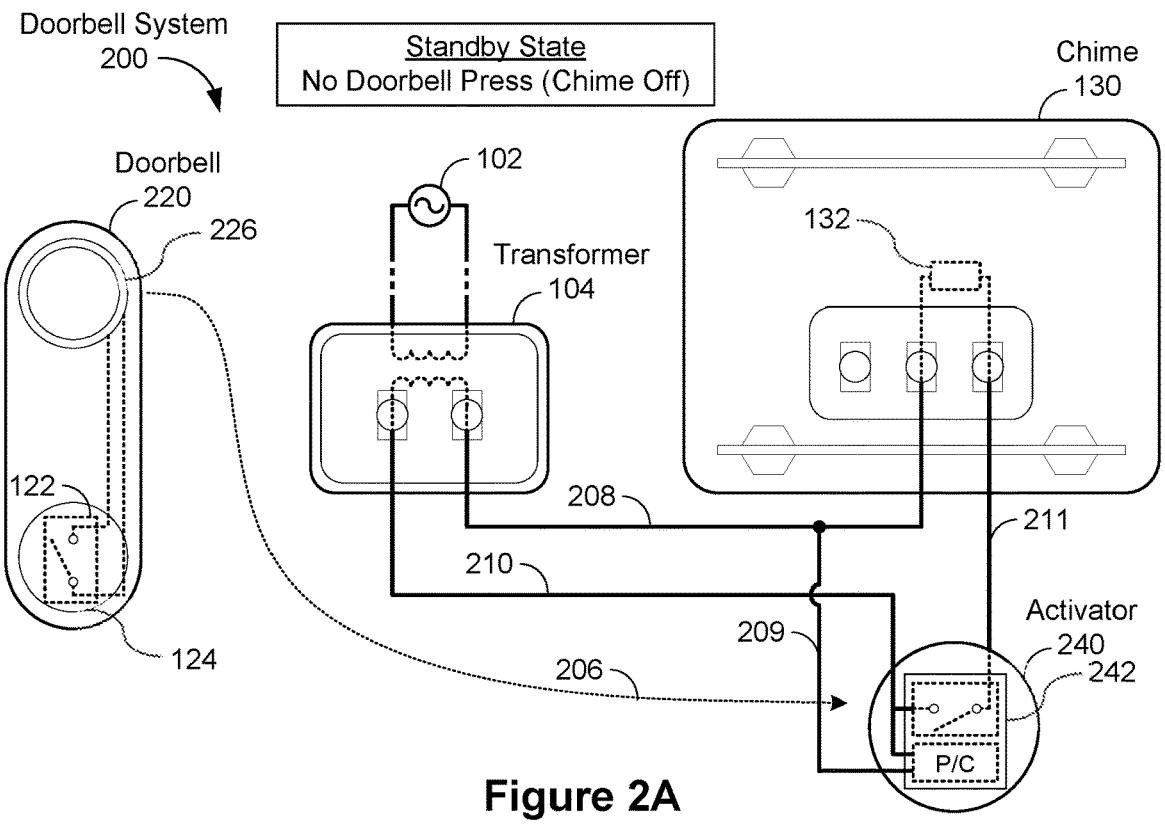
FIG. 2A is a diagram of a wireless doorbell system in a standby state in accordance with some implementations.
Figure 2B:
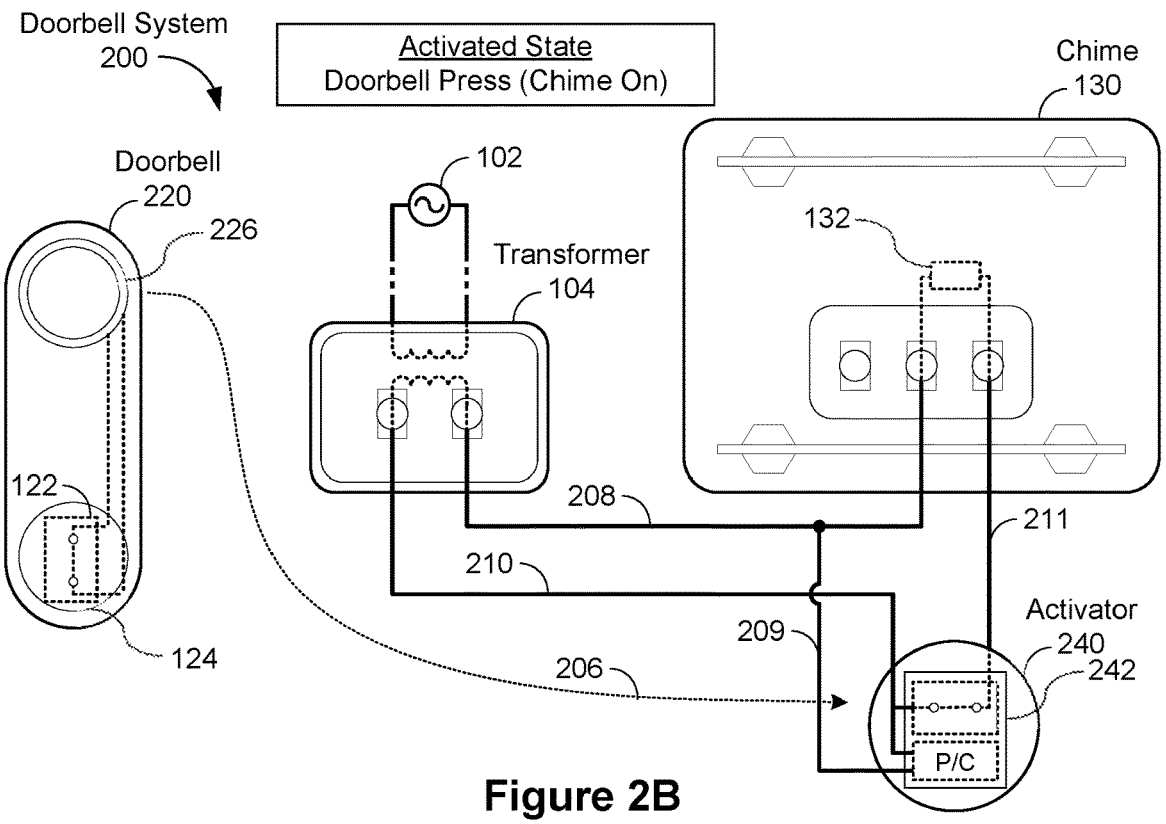
FIG. 2B is a diagram of a wireless doorbell system in an activated state in accordance with some implementations.

FIGS. 2A and 2B are diagrams of a doorbell system 200 during various stages of a doorbell press event in accordance with some implementations. FIG. 2A depicts the doorbell system 200 in a standby state (a doorbell button 124 has not been pressed for at least a threshold of time, and the chime is off), and FIG. 2B depicts the doorbell system 200 in an activated state (the doorbell button 124 is being pressed or has been pressed within a threshold of time, and the chime is on). Features corresponding to those described above with reference to with FIGS. 1A and 1B are similarly numbered. The doorbell system 200 includes a wireless doorbell 220, a chime 130, and chime activation circuitry 240 (also referred to as an activator 240). The aforementioned components are electrically coupled via electrical lines (e.g., wires) 208, 209, 210, and 211, and a wireless communication channel 206. Lines 208 and 209 electrically couple the transformer 104 to the chime 130 and the activator 240, line 210 electrically couples the transformer 104 to the activator 240, line 211 electrically couples the chime 130 to the activator, and the wireless communication channel 206 communicatively couples the doorbell 220 to the activator 240. The channel 206 may be implemented over a communication network using a wireless communication protocol (e.g., any of WiFi, Bluetooth, ZigBee, Z-Wave, 6LoWPAN, Thread, 4G, 5G, and the like).

The chime 130 may be AC-powered or DC-powered. For AC-powered chimes (as depicted in FIGS. 2A and 2B), the doorbell system 200 includes an AC power source 102 and a transformer 104. The AC power source 102 may be mains power (e.g., a 120 VAC line signal entering a structure at a circuit breaker panel), and the transformer 104 may convert the mains power to a lower voltage (e.g., 24 VAC) to power the doorbell 220 and the chime 130. For DC-powered chimes (not depicted), the doorbell system would include a DC power source (not depicted) instead of or in addition to the AC power source 102 and, optionally, a power converter (e.g., a buck converter, not depicted) instead of or in addition to the transformer 104.

The wireless doorbell 220 is powered by a battery (not shown), and includes a button 124 and doorbell system circuitry 226. When pressed, the button 124 causes doorbell switch circuitry 122 to close a doorbell switch (described in more detail below with reference to switch 302 depicted in FIG. 3), thereby sending a doorbell button press signal to the doorbell system circuitry 226. The doorbell switch circuitry 122 may keep the doorbell switch closed for as long as the button 124 is pressed, or for a threshold of time (e.g., a user-programmable threshold) after the button 124 has initially been pressed or has been released. The doorbell system circuitry 226 may include a camera (including an image sensor and image processing circuitry), a motion sensor, a microphone, a speaker, a transceiver, a processor, and/or any other electronic components configured to implement features of the doorbell system 220.

The chime 130 may be a mechanical chime (e.g., an electromagnetic chime including a solenoid 132 as depicted in FIGS. 2A and 2B) or an electronic chime (not depicted). The chime 130 may be powered by a voltage signal as low as 8V RMS (or lower), or as high as 28V RMS (or higher). Mechanical chimes may draw (i) a relatively low in-rush current (e.g., to charge an inductor) and (ii) a relatively high steady state current (e.g., to keep the solenoid 132 actuated or an armature moving). Electronic chimes, on the other hand, may draw (i) a relatively high in-rush current (e.g., to charge an input capacitor), and (ii) a relatively low steady state current (e.g., to power digital circuitry).

The activator 240 includes switch circuitry 242 implementing an activation switch (described in more detail below with reference to switch 502 depicted in FIG. 5) and power/control (P/C) circuitry (described I more detail below with reference to elements 506 and 508 in FIG. 5). While the activation switch in switch circuitry 242 is open, all current in lines 208, 209, and 210 flows through the power/control circuitry of the switch circuitry 242, thereby deactivating the chime 130. Conversely, when the activation switch in switch circuitry 242 is closed, current flowing through lines 208, 210, and 211 is directed through the chime 130 (e.g., through the solenoid 132), thereby causing the chime 130 to be activated.

The configurations of the doorbell switch in switch circuitry 122 and the activation switch in switch circuitry 242 determine whether the doorbell system 200 is in the standby state (no doorbell press, chime off) or the activated state (doorbell press, chime on).

Referring to FIG. 2A (standby state), while the doorbell button 124 is not pressed, both the doorbell switch in switch circuitry 122 and the activation switch in switch circuitry 242 are open, deactivating the chime 130 as described above. In sum, the current path in the standby state includes the transformer 104, line 208, line 209, power/control circuitry of switch circuitry 242, and line 210.

Referring to FIG. 2B (activation state), when the doorbell button 124 is pressed, the doorbell switch in switch circuitry 122 closes, which causes a doorbell button press signal to be sent to the doorbell system circuitry 226. Upon receiving the doorbell button press signal, a transmitter in the doorbell system circuitry 226 transmits a chime activation signal over the wireless communication channel 206 to a receiver in the activation switch circuitry 242. The activation switch circuitry 242 receives the chime activation signal, which causes the activation switch circuitry 242 to close the activation switch. With the activation switch closed, current flowing through lines 208, 210, and 211 is directed to the chime 130, which causes the chime 130 to be activated. In sum, the current path in the activated state includes the transformer 104, line 208, chime 130, line 211, activation switch of switch circuitry 242, and line 210 (also, power/control circuitry of activation circuitry 242 and line 209 remain part of the current path). Stated another way, the internal power/control circuitry of the activation circuitry 240 is in parallel with the chime 130, and the activation switch of the activation circuitry 240 is in series with the chime 130 (when the activation switch is closed and the chime is activated).

The chime activation signal may include an instruction for the chime 130 to be activated for a predetermined amount of time or a programmable amount of time (e.g., as selected in a doorbell application on a user device). The user may select an amount of time needed for the chime 130 to finish sounding (e.g., as short as 0.3 seconds (or shorter), or as long as 10 seconds (or longer)). After this time has passed, the activation switch circuitry 242 opens the activation switch, which cuts off power to the chime 130. At this point, the doorbell system 200 is back in the standby state and the chime 130 is off. Alternatively, the chime activation signal does not include an instruction for the chime 130 to be activated for the predetermined amount of time or the programmable amount of time. Instead, the transmitter in the doorbell system circuitry 226 transmits a chime deactivation signal over the wireless communication channel 206 to the receiver in the activation switch circuitry 242 after the predetermined or programmable amount of time has passed. Upon receiving the chime deactivation signal, the activation switch circuitry 242 opens the activation switch, which cuts off power to the chime 130. At this point, the doorbell system 200 is back in the standby state and the chime 130 is off.

Doorbell Switch Circuitry

Figure 3:
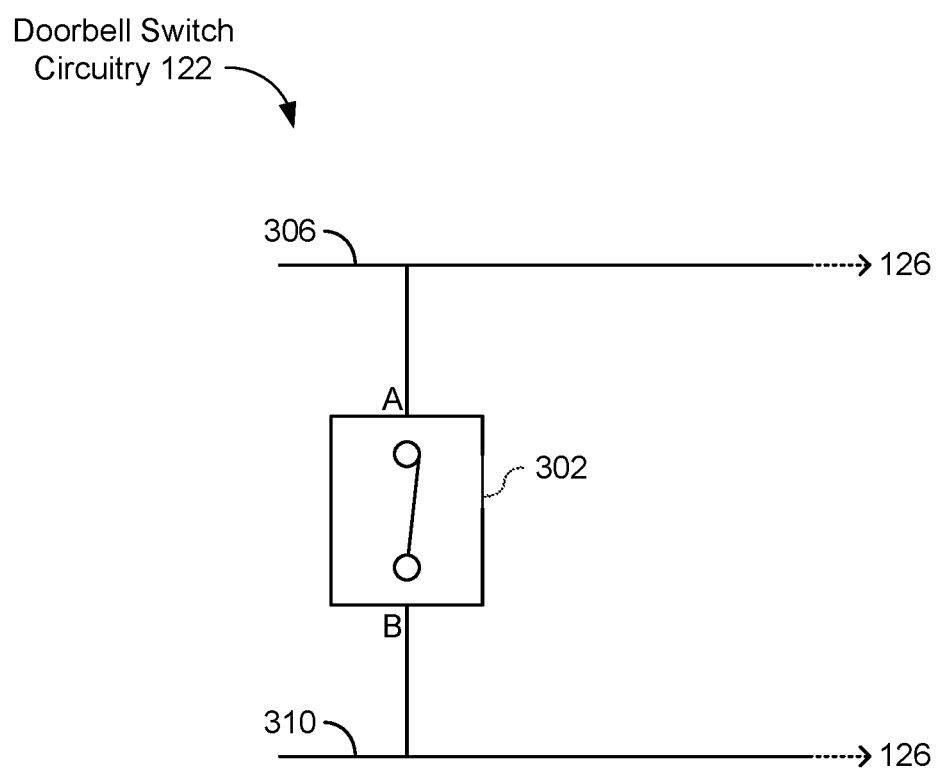
FIG. 3 is a schematic of doorbell switch circuitry for the wired doorbell system described with reference to FIGS. 1A and 1B and the wireless doorbell system described with reference to FIGS. 2A and 2B in accordance with some implementations.

FIG. 3 is a schematic of the doorbell switch circuitry 122 for the wired doorbell system 100 described above with reference to FIGS. 1A and 1B and the wireless doorbell system 200 described above with reference to FIGS. 2A and 2B in accordance with some implementations. The doorbell switch circuitry 122 includes a bi-directional FET switch 302 in series with a first node 306 and a second node 310. For wired doorbell implementations (doorbell system 100, FIGS. 1A and 1B), the first node 306 and the second node 310 are respectively coupled to wires 106 and 110 (FIGS. 1A and 1B). For wireless doorbell implementations (doorbell system 200, FIGS. 2A and 2B), the first node 306 and the second node are respectively coupled to terminals of a doorbell power source included in doorbell system circuitry 126. In both wired and wireless implementations, the first node 306 and the second node 308 may be respectively coupled to one or more other elements of the doorbell system circuitry 126 (described above), such that the bi-directional FET switch 302 is in series with the doorbell power circuitry and the one or more other elements of the doorbell system circuitry 126.

The bi-directional FET switch 302 is disposed in a normally-open configuration. When the doorbell button 124 (FIG. 1) is pressed, the bi-directional FET switch 302 closes. In some implementations, upon being pressed, the doorbell button 124 causes a signal to be transmitted to circuitry implementing the bi-directional FET switch 302 (e.g., SSR IC 600, FIG. 6), causing such circuitry to close the bi-directional FET switch 302. In some implementations, an additional resistor (not shown) is disposed in series with the first and second nodes 306 and 310 and in parallel with the bi-directional FET switch 302 to accommodate leakage current.

Bypass Switch Circuitry

Figure 4:
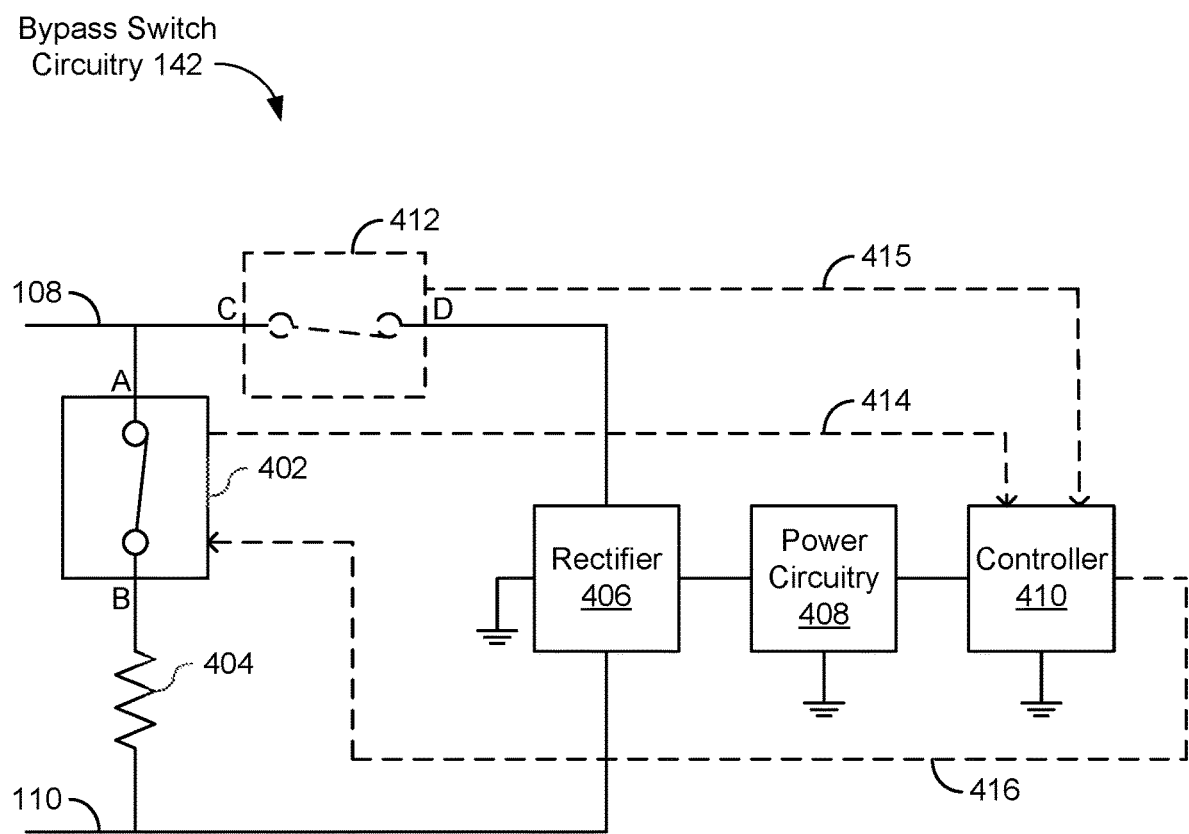
FIG. 4 is a schematic of bypass switch circuitry for the wired doorbell system described with reference to FIGS. 1A and 1B in accordance with some implementations.

FIG. 4 is a schematic of the bypass switch circuitry 142 for the wired doorbell system 100 described above with reference to FIGS. 1A and 1B in accordance with some implementations. The bypass switch circuitry 142 includes a bi-directional FET switch 402 in series with a first current input/output node 108 and a second current input/output node 110 (corresponding to wires 108 and 110 described above with reference to FIGS. 1A and 1B). The bi-directional FET switch 402 is disposed in a normally-closed configuration. The bypass switch circuitry 142 includes a resistor 404 in series with the bi-directional FET switch 402 and the first and second nodes 108 and 110. Due to switches in both the doorbell switch circuitry 122 and the bypass switch circuitry 142 being closed at the beginning of a doorbell button press (after the doorbell button 124 is pressed but before bi-directional FET switch 402 has a chance to open), the resistor 404 limits the maximum transformer 104 output, thereby preventing a short circuit. In some implementations, an additional resistor (not shown) is disposed in series with the first and second nodes 108 and 110 and in parallel with the bi-directional FET switch 402 and the resistor 404 to accommodate leakage current.

In some implementations, the bypass switch circuitry 142 includes a rectifier 406 (e.g., a bridge rectifier) configured to convert the AC signal between the first and second nodes 108 and 110 to a DC signal, which is further processed by power circuitry 408. The power circuitry 408 may include a DC-to-DC step-down converter (e.g., a buck converter) to convert the rectified DC signal to a power signal (e.g., 1.8 VDC) that may be used by a controller 410.

While the bi-directional FET switch 402 is closed, circuitry implementing the bi-directional FET switch 402 (e.g., 622, FIG. 6) may be configured to sense an increase in current between the terminals (labeled A and B) of the switch 402 (e.g., caused by a doorbell button press). Upon detecting such an increase in current, the circuitry implementing the bi-directional FET switch 402 causes the switch 402 to open, thereby causing the chime 130 to be activated as described above. Optionally, the circuitry implementing the bi-directional FET switch 402 (e.g., 600, FIG. 6) may be configured to transmit (via signal path 414) the sensed current levels to the controller 410. The controller 410 may use the sensed current levels as a basis for controlling the switching function of the bi-directional FET switch 402 (via signal path 416) and/or as a basis for performing health/maintenance operations of the bypass switch circuitry 142.

While the bi-directional FET switch 402 is open, circuitry implementing the bi-directional FET switch 402 (e.g., 622, FIG. 6) may be configured to sense a decrease in voltage across the terminals (labeled A and B) of the switch 402 (e.g., caused by a doorbell button release or timeout). Upon detecting such a decrease in voltage, the circuitry implementing the bi-directional FET switch 402 causes the switch 402 to close, thereby causing the chime 130 to be bypassed as described above. Optionally, the circuitry implementing the bi-directional FET switch 402 (e.g., 600, FIG. 6) may be configured to transmit (via signal path 414) the sensed voltage levels to the controller 410. The controller 410 may use the sensed voltage levels as a basis for controlling the switching function of the bi-directional FET switch 402 (via signal path 416) and/or as a basis for performing health/maintenance operations of the bypass switch circuitry 142.

The bypass switch circuitry 142 optionally includes a second bi-directional FET switch 412 in series with the first node 108 and the rectifier 406. The second bi-directional FET switch 412 includes circuitry (e.g., 620b, FIG. 8) that may be configured to sense current between and/or voltage across the terminals (labeled C and D) of the switch 412. The current/voltage monitoring circuitry in the second bi-directional FET switch 412 transmits (via signal path 415) current/voltage levels to the controller 410. Based on the monitored current/voltage levels, the controller 410 determines whether the doorbell system 100 is in the standby state or the activated state as described above, and transmits configuration instructions (via signal path 416) to the first bi-directional FET switch 402 regarding whether to open or close the switch 402. For example, if the monitored current level (while the bi-directional FET switch 412 is closed) meets a doorbell press current threshold, the controller 410 transmits an open instruction 416 to the bi-directional FET switch 402, causing the bi-directional FET switch 402 to open, thereby activating the chime 130. Likewise, if the monitored voltage level (while the bi-directional FET switch 412 is open) falls below the doorbell press current threshold (or falls below a doorbell release current threshold lower than the doorbell press current threshold), the controller 410 transmits a close instruction 416 to the bi-directional FET switch 402, causing the bi-directional FET switch 402 to close, thereby bypassing the chime 130.

Figure 5:
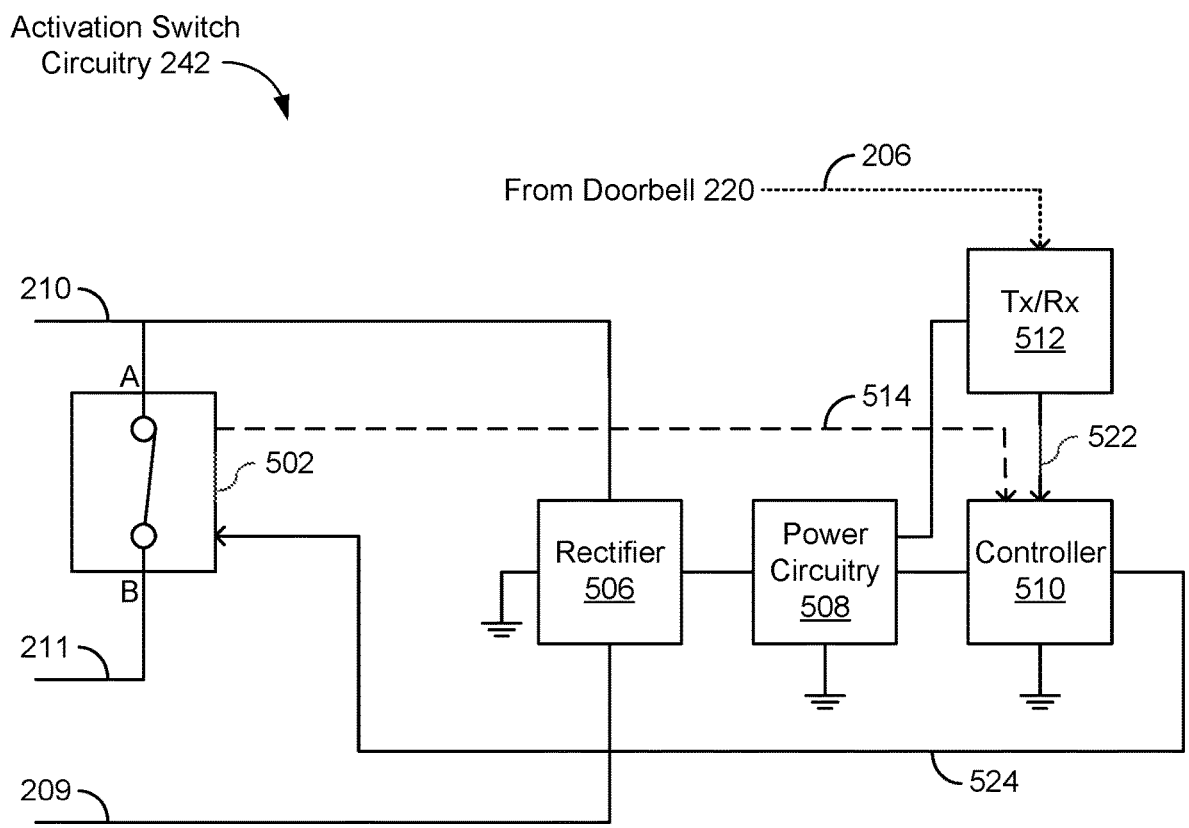
FIG. 5 is a schematic of bypass switch circuitry for the wireless doorbell system described with reference to FIGS. 2A and 2B in accordance with some implementations.

FIG. 5 is a schematic of the activation switch circuitry 242 for the wireless doorbell system 200 described above with reference to FIGS. 2A and 2B in accordance with some implementations. The activation switch circuitry 242 includes a bi-directional FET switch 502 in series with a first current input/output node 210 and a second current input/output node 211 (corresponding to wires 210 and 211 described above with reference to FIGS. 2A and 2B). The bi-directional FET switch 502 is disposed in a normally-open configuration.

In some implementations, the activation switch circuitry 242 includes a rectifier 506 (e.g., a bridge rectifier) configured to convert the AC signal between nodes 209 and 210 to a DC signal, which is further processed by power circuitry 508. The power circuitry 508 may include a DC-to-DC step-down converter (e.g., a buck converter) to convert the rectified DC signal to a power signal (e.g., 1.8 VDC) that may be used by a controller 510 and a transceiver 512.

While the bi-directional FET switch 502 is open, the transceiver 512 may receive a chime activation signal via the wireless communication channel 206 as described above with reference to FIG. 2A. The transceiver 512 conveys the chime activation signal (via signal path 522) to the controller 510. Upon receiving the chime activation signal, the controller 510 transmits an close signal (via signal path 524) to the bi-directional FET switch 502 causing the switch 502 to close, thereby activating the chime 130 as described above with reference to FIG. 2B. Optionally, the controller 510 may transmit the close signal (via signal path 524) to the bi-directional FET switch 502 based on a current or voltage level sensed by the circuitry implementing the bi-directional FET switch 502 (e.g., 600, FIG. 6), which is received at the controller 510 via signal path 514.

While the bi-directional FET switch 502 is closed, the transceiver 512 may receive a chime deactivation signal (or a predetermined or programmable timeout may have occurred after having received the chime activation signal). The transceiver 512 conveys the chime deactivation signal (via signal path 522) to the controller 510. Upon receiving the chime deactivation signal, the controller 510 transmits an open signal (via signal path 524) to the bi-directional FET switch 502 causing the switch 502 to open, thereby deactivating the chime 130 as described above with reference to FIG. 2A. Optionally, the controller 510 may transmit the open signal (via signal path 524) to the bi-directional FET switch 502 based on a current or voltage level sensed by the circuitry implementing the bi-directional FET switch 502 (e.g., 600, FIG. 6), which is received at the controller 510 via signal path 514.

Bi-Directional FET Switch Control Circuitry

Figure 6:
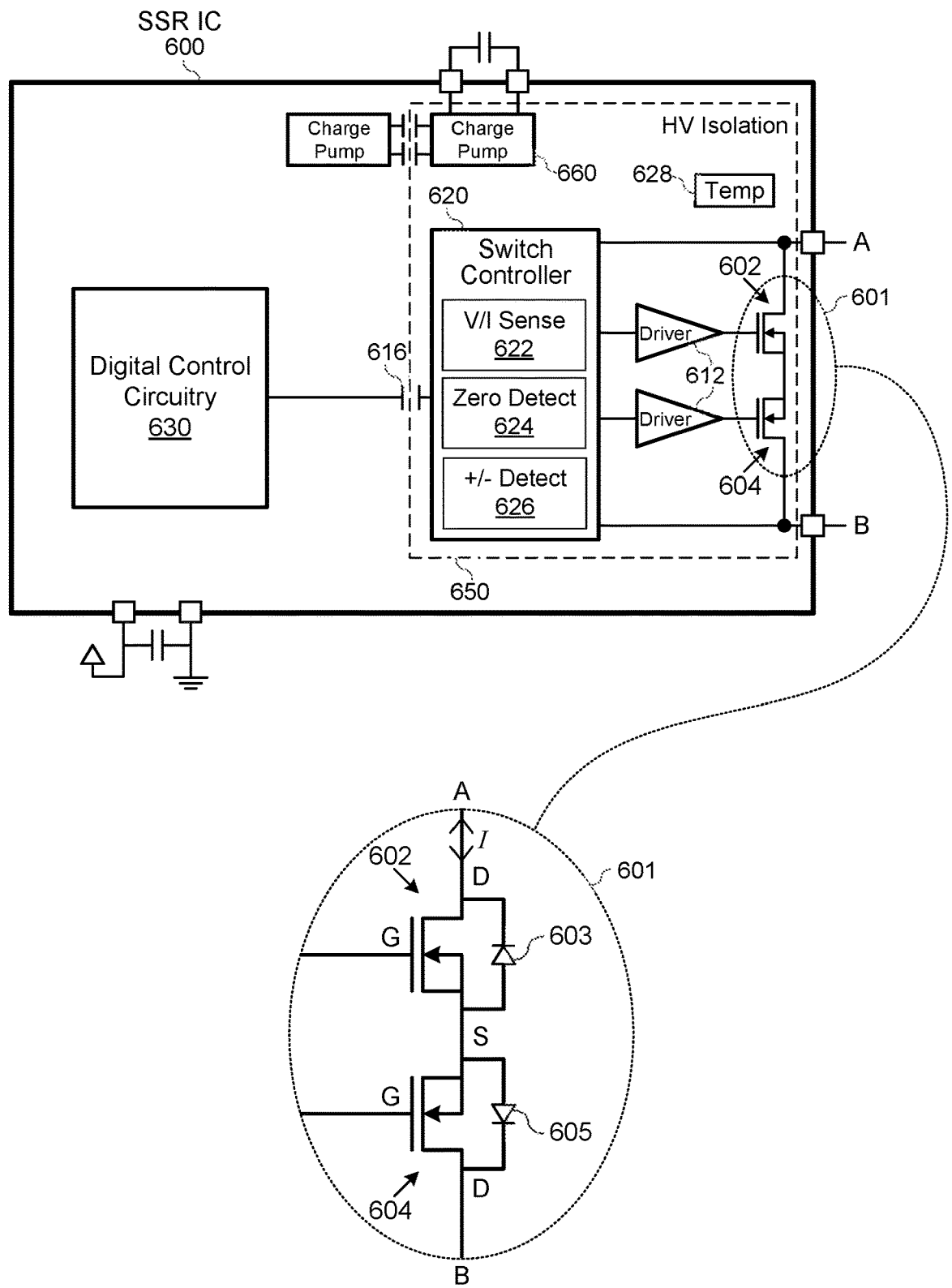
FIG. 6 is a schematic of an SSR integrated circuit with one bi-directional FET switch in accordance with some implementations.

FIG. 6 is a schematic of an SSR integrated circuit (IC) 600 including a bi-directional FET switch 601 and supporting circuitry in accordance with some implementations. In some implementations, switch 302 (FIG. 3), switch 402 (FIG. 4), and/or switch 502 (FIG. 5) comprise an instance of the SSR IC 600. Stated another way, switch 302 (FIG. 3), switch 402 (FIG. 4), and/or switch 502 (FIG. 5) may be implemented by a bi-directional FET switch 601 and supporting circuitry in an SSR IC 600. An SSR IC 600 may be installed in the doorbell switch circuitry 122 (FIG. 3), the bypass switch circuitry 142 (FIG. 4), and/or the activation switch circuitry 242 (FIG. 5) such that terminals A and B of the SSR IC 600 respectively correspond to terminals A and B in switches 302, 402, and/or 502.

Referring to the SSR IC 600, terminals A and B correspond to the drain terminals (labeled D in FIG. 6) of two FETs 602 and 604 of the bi-directional FET switch 601. The two FETs 602 and 604 of the bi-directional FET switch 601 are in series and share a common source terminal (labeled S in FIG. 6). The bi-directional FET switch 601 is configured to conduct current I between terminals A and B when respective gate voltages of the FETs 602/604 are above a cut-off threshold. In this state, the FETs 602/064 are on and the switch 601 is closed. The bi-directional FET switch 601 is configured to cease or forgo conducting current I between terminals A and B when respective gate voltages of the FETs 602/604 are below the cut-off threshold. In this state, the FETs 602/604 are off and the switch 601 is open. In some implementations, the FETs 602/604 are N-channel enhancement mode FETs.

The SSR IC 600 includes a switch controller 620 that is configured to control gate drivers 612, which respectively set the gate voltages of the FETs 602/604. The switch controller 620 includes, is coupled to, or is otherwise associated with voltage/current sensing circuitry 622 configured to (i) determine an amount of current I flowing through the switch 601 (FETs 602/604 between terminals A and B) when the switch 601 is closed (conducting current), and (ii) determine the voltage across the switch 601 (between terminals A and B) when the switch 601 is open (not conducting current).

In the doorbell switch circuitry 122 (FIG. 3) for a wired doorbell system 100 or a wireless doorbell system 200, the switch 601 (corresponding to switch 302) of the SSR IC 600 is in a normally open configuration, and the switch controller 620 closes the switch 601 as a result of a doorbell button press, as described above with reference to FIGS. 1A, 1B, and 3. The normally open configuration of the switch 601 may be implemented by a fuse map of the SSR IC 600 causing the switch controller 620 to automatically turn off the FETs 602/604 (set their gate voltages to a level below the cut-off threshold) when the SSR IC 600 powers up.

When the doorbell button is pressed, the switch controller 620 turns on the FETs 602/604 (sets their gate voltages to a level above the cut-off threshold), thereby closing the switch 601. As a result of the switch 601 closing, the switch conducts current between terminals A and B, decreasing the resistance between nodes 106 and 110 (FIG. 1B) at the doorbell 120, which increases the current reaching the bypass 140 (FIG. 1B), which causes the bypass 140 to activate the chime 130 as described above.

When the doorbell button is released (or within a predetermined amount of time after the release), the switch controller 620 turns off the FETs 602/604 (sets their gate voltages to a level below the cut-off threshold), thereby opening the switch 601. As a result of the switch 601 opening, the switch ceases conducting current between terminals A and B, increasing the resistance between nodes 106 and 110 (FIG. 1A) at the doorbell 120, which decreases the current reaching the bypass 140 (FIG. 1A), which causes the bypass 140 to deactivate the chime 130 as described above.

In the bypass switch circuitry 142 (FIG. 4) for a wired doorbell system 100, the switch 601 (corresponding to switch 402) of the SSR IC 600 is in a normally closed configuration, and the switch controller 620 opens the switch 601 as a result of a doorbell press, as described above with reference to FIGS. 1A, 1B, and 4. The normally closed configuration of the switch 601 may be implemented by a fuse map of the SSR IC 600 causing the switch controller 620 to automatically turn on the FETs 602/604 (set their gate voltages to a level above the cut-off threshold) when the SSR IC 600 powers up. Alternatively, the controller 410 may be configured to control the switch controller 620 (via signal path 416) to turn on the FETs 602/604 when the SSR IC 600 powers up.

When the doorbell button is pressed, the switch controller 620 turns off the FETs 602/604 (sets their gate voltages to a level below the cut-off threshold), thereby opening the switch 601. Specifically, the switch controller 620 may be configured to open the switch 601 when the voltage/current sensing circuitry 622 senses that the amount of current I flowing through the bi-directional FET switch 601 meets a doorbell press current threshold (due to the doorbell button 124 being pressed). Alternatively, the switch controller 620 may be configured to open the switch 601 according to an instruction received from the controller 410 (via signal path 416) based on sensed current levels received by the controller 410 (via signal path 414 or 415) meeting the doorbell press current threshold. As a result of the switch 601 opening (the gate voltages of the FETs 602/604 being below the cut-off threshold), the switch 601 ceases conducting current between terminals A and B, redirecting the current to the chime 130, which causes the chime 130 to be activated (e.g., a solenoid 132 of the chime 130 actuates) as described above with reference to FIGS. 1A and 1B.

When the doorbell button is released (or within a predetermined amount of time after the release), the switch controller 620 turns on the FETs 602/604 (sets their gate voltages to a level above the cut-off threshold), thereby closing the switch 601. Specifically, the switch controller 620 may be configured to close the switch 601 when the voltage/current sensing circuitry 622 senses that the amount of voltage across switch 601 drops below a doorbell press voltage threshold or a doorbell release voltage threshold (due to the doorbell button 124 being released). Alternatively, the switch controller 620 may be configured to close the switch 602 according to an instruction received from the controller 410 (via signal path 416) based on sensed voltage levels received by the controller 410 (via signal path 414 or 415) dropping below the doorbell press voltage threshold or the doorbell release voltage threshold. As a result of the switch 601 closing (the gate voltages of the FETs 602/604 being above the cut-off threshold), the switch 601 resumes conducting current between terminals A and B, redirecting current away from the chime 130, which causes the chime 130 to be deactivated (e.g., the solenoid 132 of the chime 130 forgoes actuation) as described above with reference to FIGS. 1A and 1B.

In the activation switch circuitry 242 (FIG. 5) for a wireless doorbell system 200, the switch 601 (corresponding to switch 502) of the SSR IC 600 is in a normally open configuration, and the switch controller 620 closes the switch 601 as a result of a doorbell press, as described above with reference to FIGS. 2A, 2B, and 5. The normally open configuration of the switch 601 may be implemented by a fuse map of the SSR IC 600 causing the switch controller 620 to automatically turn off the FETs 602/604 (set their gate voltages to a level below the cut-off threshold) when the SSR IC 600 powers up. Alternatively, the controller 510 may be configured to control the switch controller 620 (via signal path 524) to turn off the FETs 602/604 when the SSR IC 600 powers up.

When the doorbell button is pressed, the switch controller 620 turns on the FETs 602/604 (sets their gate voltages to a level above the cut-off threshold), thereby closing the switch 601. Specifically, the switch controller 620 may be configured to close the switch 601 when the SSR IC 600 receives a corresponding signal (via path 524) from the controller 510 of the activation switch circuitry 242 (due to the doorbell button 124 having been pressed, as described above with reference to FIG. 2B). As a result of the switch 601 closing, the switch 601 conducts current between nodes 210 and 211, thereby causing the chime 130 to be activated (e.g., a solenoid 132 of the chime 130 actuates) as described above with reference to FIGS. 2B and 5.

When the doorbell button is released (or upon the expiration of a timeout after the doorbell button is pressed), the switch controller 620 turns off the FETs 602/604 (sets their gate voltages to a level below the cut-off threshold), thereby opening the switch 601. Specifically, the switch controller 620 may be configured to open the switch 601 when the SSR IC 600 receives a corresponding signal (via path 524) from the controller 510 of the activation switch circuitry 242 (due to the doorbell button 124 having been released or the timeout having been elapsed, as described above with reference to FIGS. 2A and 2B). As a result of the switch 601 opening, the switch 601 ceases conducting current between nodes 210 and 211, thereby causing the chime 130 to be deactivated (e.g., a solenoid 132 of the chime 130 forgoes actuation) as described above with reference to FIGS. 2A and 5.

While the SSR IC 600 described with reference to FIG. 6 has only one bi-directional FET switch, an SSR IC may include two or more bi-directional FET switches in accordance with some implementations. Such an SSR IC may implement the switches in a gang mode (in parallel). As such, additional switching functionality may be achieved while taking advantage of existing control circuitry (e.g., digital control circuitry 630 as described in more detail below).

Figure 7:
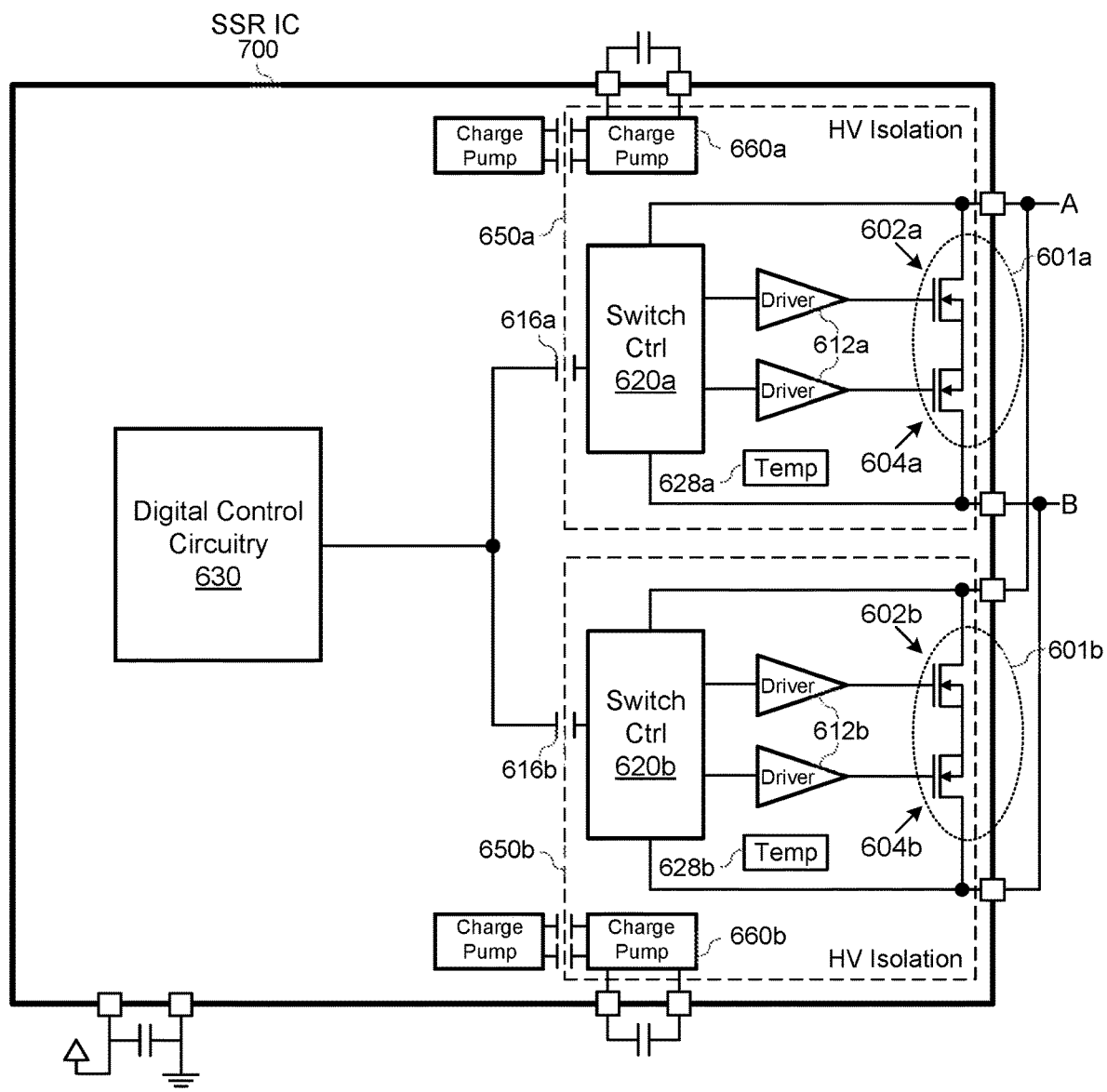
FIG. 7 is a schematic of an SSR integrated circuit with two bi-directional FET switches implemented in parallel in accordance with some implementations.
Figure 8:
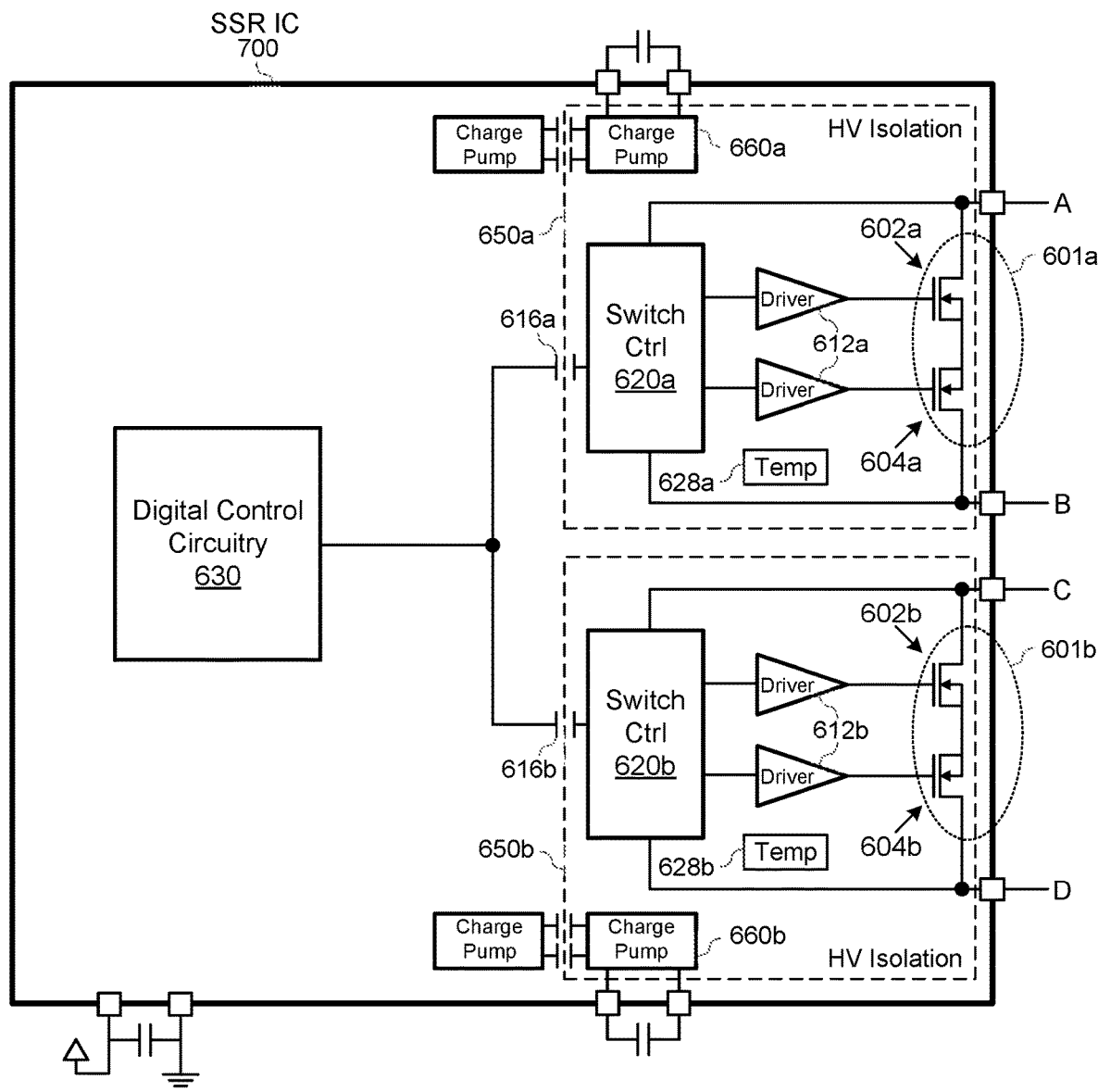
FIG. 8 is a schematic of an SSR integrated circuit with two bi-directional FET switches in accordance with some implementations.

FIGS. 7 and 8 are schematics of an SSR IC 700 having two bi-directional FET switches 601a and 601b in accordance with some implementations. Each of the switches has two FETs (switch 601a includes FETs 602a/604a, and switch 601b includes FETs 602b/604b), and each switch is implemented as described with reference to switch 601 in SSR IC 600 (FIG. 6). Features shared with FIG. 6 are similarly numbered, with the addition of an "a" or "b" following the item numbers to differentiate between elements of the first switch 601a (item numbers ending in "a") and the second switch 601b (item numbers ending in "b"). The items corresponding to those discussed elsewhere in this disclosure are not further discussed here for purposes of brevity.

Referring to FIG. 7, both of the bi-directional FET switches 601a and 601b are externally coupled in parallel in accordance with some implementations. In some implementations, switch 302 (FIG. 3), switch 402 (FIG. 4), and/or switch 502 (FIG. 5) comprise an instance of the SSR IC 700. Stated another way, switch 302 (FIG. 3), switch 402 (FIG. 4), and/or switch 502 (FIG. 5) may be implemented by two bi-directional FET switches 601a/601b in parallel and controlled by a single instance of digital control circuitry 630 in an SSR IC 700. Both of the switches 601a/601b are configured to operate in a gang mode, meaning both switches open and close in sync. For example, the switch controller 620b may be configured to set the gate voltages of the FETs 602b/604b to a level corresponding to that of the gate voltages of the FETs 602a/604a (thereby causing the second switch 601b to open and close along with the first switch 601a).

By including two bi-directional FET switches in the SSR IC 700, the amount of space in the IC dedicated to switching a single current path (e.g., conducting current through the switches 601a/601b between terminals A and B) may be doubled, allowing for improved heat management in the doorbell 220, the bypass 140, and or the activator 240. In addition, the gang-mode configuration allows for more versatility of the SSR IC 700 since the same IC design may be used for a circuit having the configuration described below with reference to FIG. 8 (two switches in two different current paths) or for a circuit having the configuration described above with reference to FIG. 7 (two switches in the same current path) without requiring separate IC configurations.

Referring to FIG. 8, each of the bi-directional FET switches 601a and 601b are externally coupled to two different current paths. In some implementations, switches 402/412 (FIG. 4) comprise an instance of the SSR IC 700 as implemented in FIG. 8. Stated another way, switch 402 (FIG. 4) may be implemented by switch 601a (FIG. 8), and switch 412 (FIG. 4) may be implemented by switch 602b (FIG. 8). Both of the switches 601a/601b are controlled by a single instance of digital control circuitry 630 in the SSR IC 700. Both of the switches 601a/601b are configured to operate independently, rather than in the gang mode configuration described above. Even without gang mode, however, it may still be advantageous for functions of the digital control circuitry 630 and other measurement circuitry of the SSR IC 700 to be shared between the two switches 601a/601b as depicted in FIG. 8.

FET Technological Considerations

The use of solid state FET-based switching technology in doorbell devices, chime bypass devices, and chime activation devices as described herein provides a number of benefits, including compatibility with DC-powered doorbell systems, compatibility with low-power AC-powered doorbell systems that may not be able to handle the power loss of a TRIAC, compatibility with high-power AC-powered doorbell systems that may not be able to handle the thermal issues of a TRIAC, reduced heat generation, increased lifetime compared to mechanical relays, and increased lifetime compared to optoisolators necessary for driving TRIACs.

However, the use of solid state FET-based switching technology requires several considerations in order to maintain long-term functionality and safety. For example, when turning on and off a FET-based switch, timing with respect to the cycle of the AC signal needs to be accounted for in order to protect surrounding circuit elements. In addition, the order of on/off sequences for each of the two FETs in a given switch needs to be accounted for in order to protect the FETs themselves. Further, over-current, over-voltage, and over-temperature conditions at each FET switch must be prevented. These considerations not only apply to the FETs and surrounding circuitry, but can affect performance of the doorbell system as a whole if not appropriately accounted for.

With reference to FIGS. 6-8, the implementations described below account for the aforementioned considerations. Specifically, the digital control circuitry 630 may be configured to manage the timing and sequence of on/off events for the FETs of a given switch 601.

In some implementations, the switch controller 620 for a given switch 601 includes or is otherwise associated with zero-crossing detection circuitry 624, configured to sense zero-crossing events. Zero-crossing events are points in the waveform of an AC signal at which there is no voltage present. As such, the zero-crossing detection circuitry 624 detects points in time at which the voltage across the switch 601 (e.g., between nodes A and B) crosses zero in either direction. In such implementations, the digital control circuitry 630 receives zero-crossing data (e.g., timing and/or detection indications) from the zero-crossing detection circuitry 624 and manages the timing of off events so that the FETs 602/604 turn off (cease conducting current between nodes A/B) within a threshold of time of a detected zero-crossing event. The purpose of such zero-cross turn-offs is to protect the FETs by preventing over-voltage scenarios (e.g., due to energy build up in the inductive load of mechanical chimes). In some implementations, the SSR IC 600/700 includes passive clamps (not shown) that keep the FETs activated just long enough to safely dissipate extra energy (e.g., as a result of a FET not being able to turn off at the exact zero-crossing point).

In some implementations, the switch controller 620 for a given switch 601 includes or is otherwise associated with peak detection circuitry (e.g., associated with voltage/current sense circuitry 622), configured to detect peaks in the voltage across the switch 601 (e.g., between nodes A and B). The peak detection circuitry may detect voltage peaks based on a time delay after a zero-crossing voltage event (when the voltage across the switch 601 crosses 0V). For example, for a 60 Hz AC voltage system, a voltage peak can be assumed to happen about 4 ms after a zero-crossing. As such, the peak detection circuitry may determine that the voltage across the switch 601 is at its peak after a predetermined time delay based on the frequency of the voltage. In some implementations, the digital control circuitry 630 receives peak detection data (e.g., timing and/or detection indications) from the peak detection circuitry and manages the timing of on events so that the FETs 602/604 turn on (resume conducting current between nodes A/B) within a threshold of time of a detected voltage peak. The purpose of such peak turn-ons is to protect the FETs by minimizing the amount of time it takes for the FETs to turn on (e.g., by providing a relatively high gate voltage immediately rather than ramping up). If the gate voltage stays high for too long, then the switching energy can cause damage to inductive loads associated with mechanical chimes. As such, peak turn-ons are desired at each FET.

In some implementations, the switch controller 620 includes or is otherwise associated with current/voltage direction detection circuitry 626, configured to detect a direction of current I flowing through the switch 601 or the relative polarities of voltage across the switch 601 (between nodes A and B). In some implementations, the digital control circuitry 630 receives current/voltage direction data from the current flow detection circuitry 626 and manages the on/off sequencing of each of the pair of FETs for a given switch 601 based on this data (described in more detail below). Referring to the lower half of FIG. 6, each FET 602/604 by itself can only regulate current in one direction (e.g., switch on/off in one direction) because the corresponding body diode 603/605 allows current to flow in the other direction. As such, the combination of two FETs 602 and 604 in the configuration depicted in the figure (in series and with a common source) allows the switch to regulate current bi-directionally.

Specifically, when both FETs are on, alternating current I flows bi-directionally. When both FETs are off, FET 602 blocks current I from node A to node B, while FET 604 blocks current I from node B to node A. If one FET is on while the other FET is off, however, this has the potential to cause one of the body diodes to start conducting, which can trigger a parasitic bipolar transistor (BJT). The BJT is normally inactive since the base-emitter junction is shorted together. However, a very high voltage or current density can activate the parasitic BJT while the FET is off. If the parasitic BJT is activated, the FET could be destroyed because of the excessive power dissipation produced by the high current flowing through the device while the parasitic BJT is triggered. As such, it is important to get the sequencing correct (the order in which each FET is turned on and off with respect to the other FET in a given switch 601) in order to prevent the FETs from being destroyed. Since the alternating current I switches direction every half cycle of its waveform, the digital control circuitry 630 is configured to receive the current/voltage direction data from the current flow detection circuitry 626 and manage the on/off sequencing of each FET at a speed that is at least more than twice the frequency of the current I.

While the switch 601 is on and current is flowing from node A to node B, if FET 604 turns off first, FET 602 directs current to the body diode 605 of FET 604, which may cause a parasitic BJT of FET 604 to trigger, thereby destroying FET 604. However, if FET 602 turns off first, FET 602 prevents current from reaching the body diode 605 of FET 604, leaving both FETs safe. As such, when both FETs are on and while current is flowing from node A to node B, the digital control circuitry 630 is configured to cause FET 602 to turn off before FET 604.

While the switch 601 is on and current is flowing from node B to node A, if FET 602 turns off first, FET 604 directs current to the body diode 603 of FET 602, which may cause a parasitic BJT of FET 602 to trigger, thereby destroying FET 602. However, if FET 604 turns off first, FET 604 prevents current from reaching the body diode 603 of FET 602, leaving both FETs are safe. As such, when both FETs are on and while current is flowing from node B to node A, the digital control circuitry 630 is configured to cause FET 604 to turn off before FET 602.

While the switch 601 is off and the voltage potential at node A (the drain of FET 602) is higher than the voltage potential at node B (the drain of FET 604), if FET 602 turns on first, FET 602 directs current to the body diode 605 of FET 604, which may cause a parasitic BJT of FET 604 to trigger, thereby destroying FET 604. However, if FET 604 turns on first, FET 602 prevents current from reaching the body diode 605 of FET 604, leaving both FETs safe. As such, when both FETs are off and while the voltage potential at node A is higher than the voltage potential at node B, the digital control circuitry 630 is configured to cause FET 604 to turn on before FET 602.

While the switch 601 is off and the voltage potential at node B (the drain of FET 604) is higher than the voltage potential at node A (the drain of FET 602), if FET 604 turns on first, FET 604 directs current to the body diode 603 of FET 602, which may cause a parasitic BJT of FET 602 to trigger, thereby destroying FET 602. However, if FET 602 turns on first, FET 604 prevents current from reaching the body diode 603 of FET 602, leaving both FETs safe. As such, when both FETs are off and while the voltage potential at node B is higher than the voltage potential at node A, the digital control circuitry 630 is configured to cause FET 602 to turn on before FET 604.

In some implementations, the digital control circuitry 630 is configured to provide over current protection to the switch(es) 601. If the current I in a given switch 601 exceeds a predetermined current limit while the switch 601 is on, then the digital control circuitry 630 turns off (powers down) the switch 601 at the next zero-crossing event (at the time when the switch current reaches 0). For example, if the voltage/current sensing circuitry 622 detects a level of current I flowing through the switch 601 while both FETS 602/604 are on, and the detected current level exceeds an over-current threshold (as determined by the digital control circuitry 630), then the digital control circuitry 630 is configured to cause the switch 601 to turn off.

In some implementations, the digital control circuitry 630 is configured to provide over voltage protection to the switch(es) 601. If the voltage across a given switch 601 exceeds a predetermined voltage limit while the switch 601 is on or off, then the digital control circuitry 630 turns off (powers down) the switch 601 at the next zero-crossing event. Over voltages occurring immediately following a switch turn off event may be ignored in order to allow for normal ringing which can occur in inductive loads. Over voltage conditions can arise if the load is highly inductive and the switch 601 is turned off while residual current is flowing. For this reason, a blanking period may be programmed into the digital control circuitry 630, and over voltage events immediately following a turn off event may be ignored for a predetermined amount of time following the turn off event (the blanking period). For example, the voltage/current sensing circuitry 622 may detect a voltage across a given switch 601 while the FETs 602/604 are on or off. The digital control circuitry 630 may be configured to turn off (power down) the switch 601 if the detected voltage exceeds a first or a second over-voltage threshold. Specifically, the digital control circuitry 630 may turn off the switch 601 if the detected voltage exceeds (i) a first over-voltage threshold within a first time period (blanking period) after the FETs 602/604 have been turned off, or (ii) a second over-voltage threshold lower than the first over-voltage threshold following the first time period.

In some implementations, each switch 601 is associated with a temperature sensor 628. In such implementations, the switch temperature must always be below a threshold (e.g., 120° C.) for the switch to be turned on or to remain in the on state. If a switch temperature rises above the threshold, then the digital control circuitry 630 is configured to turn off the associated channel at the next zero-crossing event. For example, a temperature sensor 628 may be configured to detect a temperature proximate to a given switch 601, and the digital control circuitry 630 may be configured to cause circuitry powering the switch 601 to power down in accordance with a detected temperature proximate to the switch 601 exceeding an over-temperature threshold.

In some implementations, the SSR IC 600/700 includes additional components in order to protect the switch(es) and associated circuitry. For example, a charge pump 660 may be included with an external capacitor to move energy from the low-voltage circuitry of the switch 601. The circuitry associated with each switch 601 may be isolated within a high voltage isolation boundary 650 from other high voltage components inside the SSR IC 600/700. Signals passing through the boundary 650 area may be passed through high voltage isolation circuitry (e.g., 616).

Miscellaneous

References to drain and source configurations, N-channel and P-channel configurations, and depletion and enhancement modes of the FETs described herein may be reversed in a manner that maintains similar functionality. In addition, one or more of the components described above with reference to the SSR IC may instead be implemented as one or more discrete components external to the SSR IC.

The foregoing description has been described with reference to specific implementations. However, the illustrative discussions above are not intended to be exhaustive or to limit the claims to the precise forms disclosed. Many variations are possible in view of the above teachings. The implementations were chosen and described in order to best explain principles of operation and practical applications, to thereby enable others skilled in the art.

The various drawings illustrate a number of elements in a particular order. However, elements that are not order dependent may be reordered and other elements may be combined or separated. While some reordering or other groupings are specifically mentioned, others will be obvious to those of ordinary skill in the art, so the ordering and groupings presented herein are not an exhaustive list of alternatives.

As used herein: the singular forms "a," "an," and "the" include the plural forms as well, unless the context clearly indicates otherwise; the term "and/or" encompasses all possible combinations of one or more of the associated listed items; the terms "first," "second," etc. are only used to distinguish one element from another and do not limit the elements themselves; the term "if" may be construed to mean "when," "upon," "in response to," or "in accordance with," depending on the context; and the terms "include," "including," "comprise," and "comprising" specify particular features or operations but do not preclude additional features or operations.

What is claimed is:

1. A doorbell chime bypass circuit, comprising:
a first current input/output node;
a second current input/output node; and
a solid state relay (SSR) integrated circuit including:
a first bi-directional field effect transistor (FET) switch in series with the first current input/output node and the second current input/output node, the first bi-directional FET switch:
including a first FET and a second FET in series, and
configured to cease conducting current between the first current input/output node and the second current input/output node when a gate voltage of the first FET and a gate voltage of the second FET are below a cut-off threshold;
a first sensing circuit configured to determine a level of current flowing through the first bi-directional FET switch; and
a first switch controller configured to set the gate voltage of the first FET and the gate voltage of the second FET to a level below the cut-off threshold when the first sensing circuit senses that the level of current meets a doorbell press current threshold, causing the first bi-directional FET switch to cease conducting current between the first current input/output node and the second current input/output node.

2. The doorbell chime bypass circuit of claim 1, wherein:
the doorbell chime bypass circuit further comprises a power conversion circuit;
the SSR integrated circuit further includes:
a second bi-directional FET switch in series with the first current input/output node and the power conversion circuit, the second bi-directional FET switch:
including a third FET and a fourth FET in series, and
configured to cease conducting current between the first current input/output node and the power conversion circuit when a gate voltage of the third FET and a gate voltage of the fourth FET are below the cut-off threshold; and
a second sensing circuit configured to determine a voltage across the second bi-directional FET switch; and
a second switch controller configured to set the gate voltage of the third FET and the gate voltage of the fourth FET to a level corresponding to that of the gate voltage of the first FET and the gate voltage of the second FET; and
the first switch controller is further configured to set the gate voltage of the first FET and the gate voltage of the second FET to a level above the cut-off threshold when the second sensing circuit senses that the voltage across the second bi-directional FET switch is below a doorbell release voltage threshold, causing the first bi-directional FET switch to conduct current between the first current input/output node and the second current input/output node.

3. The doorbell chime bypass circuit of claim 2, wherein:
the doorbell chime bypass circuit is configured for electronic coupling to a doorbell chime via the first current input/output node and the second current input/output node; and
current conducting between the first current input/output node and the second current input/output node bypasses the doorbell chime, causing the doorbell chime to forgo actuation.

4. The doorbell chime bypass circuit of claim 1, wherein:
the SSR integrated circuit further includes:
- a second bi-directional FET switch in parallel with the first bi-directional FET switch, the second bi-directional FET switch:
  - including a third FET and a fourth FET in series, and configured to cease conducting current between the first current input/output node and the second current input/output node when a gate voltage of the third FET and a gate voltage of the fourth FET are below the cut-off threshold; and
- a second switch controller configured to set the gate voltage of the third FET and the gate voltage of the fourth FET to a level corresponding to that of the gate voltage of the first FET and the gate voltage of the second FET.

5. The doorbell chime bypass circuit of claim 1, wherein:
the first switch controller is further configured to detect voltage zero-crossing events at the first bi-directional FET switch; and
the SSR integrated circuit further includes digital control circuitry configured to cause the first FET and the second FET to cease conducting current between the first current input/output node and the second current input/output node within a threshold of time of a detected zero-crossing event.

6. The doorbell chime bypass circuit of claim 1, wherein:
the first switch controller is further configured to detect voltage peaks at the first bi-directional FET switch; and
the SSR integrated circuit further includes digital control circuitry configured to cause the first FET and the second FET to commence conducting current between the first current input/output node and the second current input/output node within a threshold of time of a detected voltage peak.

7. The doorbell chime bypass circuit of claim 1, wherein:
the first switch controller is further configured to determine a direction of current flowing through the first bi-directional FET switch; and
the SSR integrated circuit further includes digital control circuitry configured to:
- cause the first FET to turn off before the second FET turns off in accordance with a determination that current is flowing from the first FET to the second FET; and
- cause the second FET to turn off before the first FET turns off in accordance with a determination that current is flowing from the second FET to the first FET.

8. The doorbell chime bypass circuit of claim 1, wherein:
the first switch controller is further configured to determine relative voltage potentials at a drain of the first FET and a drain of the second FET; and
the SSR integrated circuit further includes digital control circuitry configured to:
- cause the second FET to turn on before the first FET turns on in accordance with a determination that a voltage potential at the drain of the first FET is higher than a voltage potential at the drain of the second FET; and
- cause the first FET to turn on before the second FET turns on in accordance with a determination that a voltage potential at the drain of the second FET is higher than a voltage potential at the drain of the first FET.

9. The doorbell chime bypass circuit of claim 1, wherein:
the first sensing circuit is configured to detect a level of current flowing through the first bi-directional FET switch while the first FET and the second FET are on; and
the SSR integrated circuit further includes digital control circuitry configured to cause circuitry powering the first bi-directional FET switch to power down in accordance with a detected level of current exceeding an over-current threshold.

10. The doorbell chime bypass circuit of claim 1, wherein:
the first sensing circuit is configured to detect a voltage across the first bi-directional FET switch while the first FET and the second FET are off; and
the SSR integrated circuit further includes digital control circuitry configured to cause circuitry powering the first bi-directional FET switch to power down in accordance with a detected voltage across the first bi-directional FET switch exceeding:
- a first over-voltage threshold within a first time period after the first FET and the second FET have been turned off, or
- a second over-voltage threshold lower than the first over-voltage threshold following the first time period.

11. The doorbell chime bypass circuit of claim 1, wherein:
the SSR integrated circuit further includes:
- a temperature sensor configured to detect a temperature proximate to the first bi-directional FET switch; and
- digital control circuitry configured to cause circuitry powering the first bi-directional FET switch to power down in accordance with a detected temperature proximate to the first bi-directional FET switch exceeding an over-temperature threshold.

12. A doorbell chime activation circuit, comprising:
a first current input/output node;
a second current input/output node; and
a solid state relay (SSR) integrated circuit including:
- a first bi-directional field effect transistor (FET) switch in series with the first current input/output node and the second current input/output node, the first bi-directional FET switch:
  - including a first FET and a second FET in series, and configured to commence conducting current between the first current input/output node and the second current input/output node when a gate voltage of the first FET and a gate voltage of the second FET are above a cut-off threshold;
- control circuitry configured to determine that a button of the doorbell chime activation circuit has been pressed; and
- a first switch controller configured to set the gate voltage of the first FET and the gate voltage of the second FET to a level above the cut-off threshold when the control circuitry determines that the button of the doorbell chime activation circuit has been pressed, causing the first bi-directional FET switch to commence conducting current between the first current input/output node and the second current input/output node.

13. The doorbell chime activation circuit of claim 12, wherein:
the SSR integrated circuit further includes:
- a second bi-directional FET switch in parallel with the first bi-directional FET switch, the second bi-directional FET switch:

including a third FET and a fourth FET in series, and configured to commence conducting current between the first current input/output node and the second current input/output node when a gate voltage of the third FET and a gate voltage of the fourth FET are above the cut-off threshold; and a second switch controller configured to set the gate voltage of the third FET and the gate voltage of the fourth FET to a level corresponding to that of the gate voltage of the first FET and the gate voltage of the second FET.

14. The doorbell chime activation circuit of claim 12, wherein:

the first switch controller is further configured to detect voltage zero-crossing events at the first bi-directional FET switch; and the SSR integrated circuit further includes digital control circuitry configured to cause the first FET and the second FET to cease conducting current between the first current input/output node and the second current input/output node within a threshold of time of a detected zero-crossing event.

15. The doorbell chime activation circuit of claim 12, wherein:

the first switch controller is further configured to detect voltage peaks at the first bi-directional FET switch; and the SSR integrated circuit further includes digital control circuitry configured to cause the first FET and the second FET to commence conducting current between the first current input/output node and the second current input/output node within a threshold of time of a detected voltage peak.

16. The doorbell chime activation circuit of claim 12, wherein:

the first switch controller is further configured to determine a direction of current flowing through the first bi-directional FET switch; and the SSR integrated circuit further includes digital control circuitry configured to:

cause the first FET to turn off before the second FET turns off in accordance with a determination that current is flowing from the first FET to the second FET; and cause the second FET to turn off before the first FET turns off in accordance with a determination that current is flowing from the second FET to the first FET.

17. The doorbell chime activation circuit of claim 12, wherein:

the first switch controller is further configured to determine relative voltage potentials at a drain of the first FET and a drain of the second FET; and the SSR integrated circuit further includes digital control circuitry configured to:

cause the second FET to turn on before the first FET turns on in accordance with a determination that a voltage potential at the drain of the first FET is higher than a voltage potential at the drain of the second FET; and cause the first FET to turn on before the second FET turns on in accordance with a determination that a voltage potential at the drain of the second FET is higher than a voltage potential at the drain of the first FET.

18. The doorbell chime activation circuit of claim 12, wherein:

a first sensing circuit is configured to detect a level of current flowing through the first bi-directional FET switch while the first FET and the second FET are on; and the SSR integrated circuit further includes digital control circuitry configured to cause circuitry powering the first bi-directional FET switch to power down in accordance with a detected level of current exceeding an over-current threshold.

19. The doorbell chime activation circuit of claim 12, wherein:

a first sensing circuit is configured to detect a voltage across the first bi-directional FET switch while the first FET and the second FET are off; and the SSR integrated circuit further includes digital control circuitry configured to cause circuitry powering the first bi-directional FET switch to power down in accordance with a detected voltage across the first bi-directional FET switch exceeding:

a first over-voltage threshold within a first time period after the first FET and the second FET have been turned off, or a second over-voltage threshold lower than the first over-voltage threshold following the first time period.

20. The doorbell chime activation circuit of claim 12, wherein:

the SSR integrated circuit further includes:

a temperature sensor configured to detect a temperature proximate to the first bi-directional FET switch; and digital control circuitry configured to cause circuitry powering the first bi-directional FET switch to power down in accordance with a detected temperature proximate to the first bi-directional FET switch exceeding an over-temperature threshold.

* * * * *